United States Patent
Uetani

(10) Patent No.: US 7,062,400 B2
(45) Date of Patent: Jun. 13, 2006

(54) APPARATUS AND PROGRAM FOR DESIGNING SYSTEM LSI, AND METHOD FOR VERIFYING INTEGRITY OF THE PROGRAM FOR DESIGNING SYSTEM LSI

(75) Inventor: Hironori Uetani, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 10/851,167

(22) Filed: May 24, 2004

(65) Prior Publication Data

US 2005/0120314 A1    Jun. 2, 2005

(30) Foreign Application Priority Data

Nov. 27, 2003   (JP)   ............................. 2003-397160

(51) Int. Cl.
 *G06F 19/00* (2006.01)
(52) U.S. Cl. ........................ 702/117; 702/119; 702/123; 726/26; 713/189
(58) Field of Classification Search ................. 702/117
 See application file for complete search history.

(56) References Cited

U.S. PATENT DOCUMENTS

| | | | | |
|---|---|---|---|---|
| 5,255,270 A | * | 10/1993 | Yanai et al. | 714/710 |
| 5,920,721 A | * | 7/1999 | Hunter et al. | 717/159 |
| 6,480,970 B1 | * | 11/2002 | DeKoning et al. | 714/6 |
| 6,611,779 B1 | | 8/2003 | Kohno et al. | |
| 6,634,017 B1 | * | 10/2003 | Matsui et al. | 716/11 |
| 2003/0226051 A1 | * | 12/2003 | Nakajima | 713/324 |
| 2004/0204892 A1 | * | 10/2004 | Sweet | 702/117 |
| 2005/0039148 A1 | * | 2/2005 | Masuda et al. | 716/1 |

FOREIGN PATENT DOCUMENTS

| JP | 2001-188691 | 7/2001 |
|---|---|---|
| JP | 2002-230065 | 8/2002 |

* cited by examiner

*Primary Examiner*—Marc S. Hoff
*Assistant Examiner*—Phuong Huynh
(74) *Attorney, Agent, or Firm*—Oblon, Spivak, McClelland, Maier & Neustadt, P.C.

(57) ABSTRACT

An apparatus for designing a system LSI including a configurable processor includes a series of processing programs used for the design of the system LSI, each of the processing programs configured to input a file outputted from a previous processing program and to output a file to be inputted to the following processing program. Each of the processing programs includes: an integrity information storage section configured to store integrity information between the processing programs; an integrity information identification section configured to identify integrity information included in the inputted file; an integrity verification section configured to verify whether or not integrity is maintained between the processing programs by comparing the identified integrity information and the integrity information stored in the integrity information storage section; and an integrity information addition section configured to add integrity information into the output file and then output the output file.

20 Claims, 10 Drawing Sheets

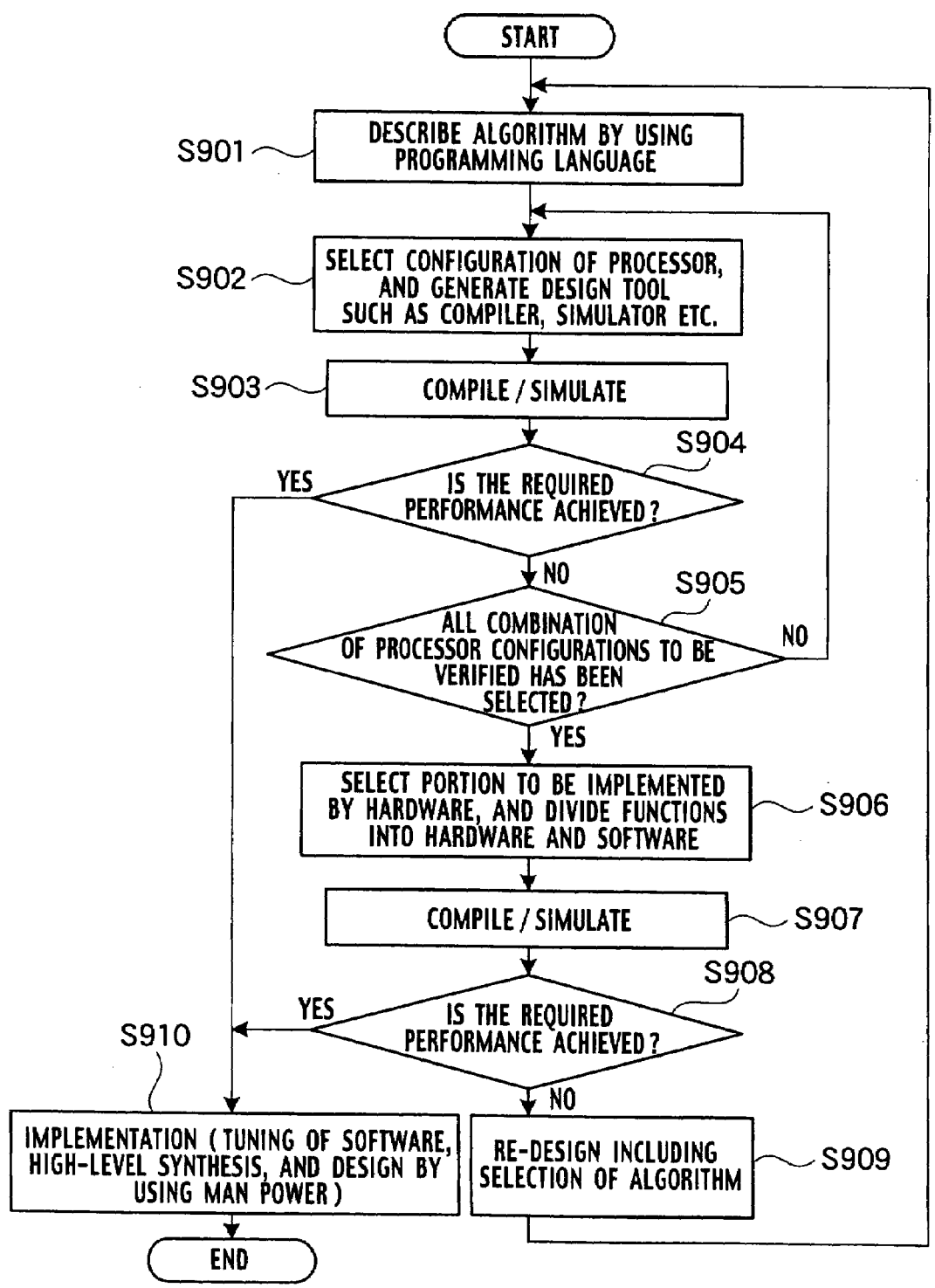

FIG. 2
PRIOR ART

| DESIGN TOOL GENERATION SOFTWARE \ CONFIGURATION OF PROCESSOR | CONFIGURATION [A] | CONFIGURATION [B] | ... |
|---|---|---|---|
| | SOURCE PROGRAM (Ver.[A]1) | SOURCE PROGRAM (Ver.[B]1) | |
| GENERATION SOFTWARE (Ver. T1)<br>COMPILER GENERATOR (Ver. 001)<br>ASSEMBLER GENERATOR (Ver. 1a)<br>LINKER GENERATOR (Ver. 10)<br>SIMULATOR GENERATOR (Ver. X)<br>DEBUGGER GENERATOR (Ver. d01)<br>⋮ | GENERATED DESIGN TOOL<br>COMPILER C ([A]T1-001)<br>ASSEMBLER A ([A]T1-1a)<br>LINKER L ([A]T1-10)<br>SIMULATOR S ([A]T1-X)<br>DEBUGGER D ([A]T1-d01)<br>⋮ | GENERATED DESIGN TOOL<br>COMPILER C ([B]T1-001)<br>ASSEMBLER A ([B]T1-1a)<br>LINKER L ([B]T1-10)<br>SIMULATOR S ([B]T1-X)<br>DEBUGGER D ([B]T1-d01)<br>⋮ | ⋯ |
| ⋮ | ⋮ | ⋮ | |

FIG. 3
PRIOR ART

| DESIGN TOOL GENERATION SOFTWARE \ CONFIGURATION OF PROCESSOR | CONFIGURATION [A] | .... |
|---|---|---|
| | SOURCE PROGRAM (Ver.[A]1) | |
| GENERATOR SOFTWARE (Ver. T1)<br>COMPILER GENERATOR (Ver. 001)<br>ASSEMBLER GENERATOR (Ver. 1a)<br>LINKER GENERATOR (Ver. 10)<br>SIMULATOR GENERATOR (Ver. X)<br>DEBUGGER GENERATOR (Ver. d01)<br>⋮ | GENERATED DESIGN TOOL<br>COMPILER C ([A]T1-001)<br>ASSEMBLER A ([A]T1-1a)<br>LINKER L ([A]T1-10)<br>SIMULATOR S ([A]T1-X)<br>DEBUGGER D ([A]T1-d01)<br>⋮ | .... |
| GENERATION SOFTWARE (Ver. T2)<br>COMPILER GENERATOR (Ver. 001)<br>ASSEMBLER GENERATOR (Ver. 1a)<br>LINKER GENERATOR (Ver. 10)<br>SIMULATOR GENERATOR (Ver. X)<br>DEBUGGER GENERATOR (Ver. d01)<br>⋮ | GENERATED DESIGN TOOL<br>COMPILER C ([A]T1-001)<br>ASSEMBLER A ([A]T1-1a)<br>LINKER L ([A]T1-10)<br>SIMULATOR S ([A]T1-X)<br>DEBUGGER D ([A]T1-d01)<br>⋮ | .... |
| ⋮ | ⋮ | |

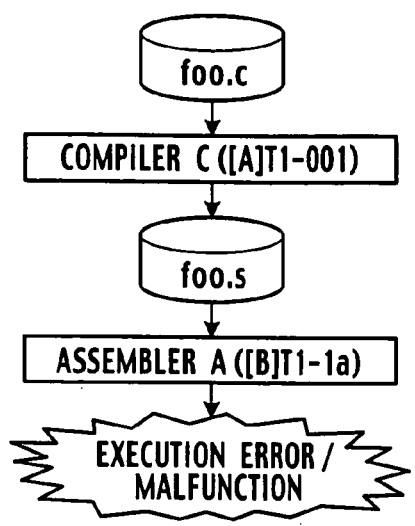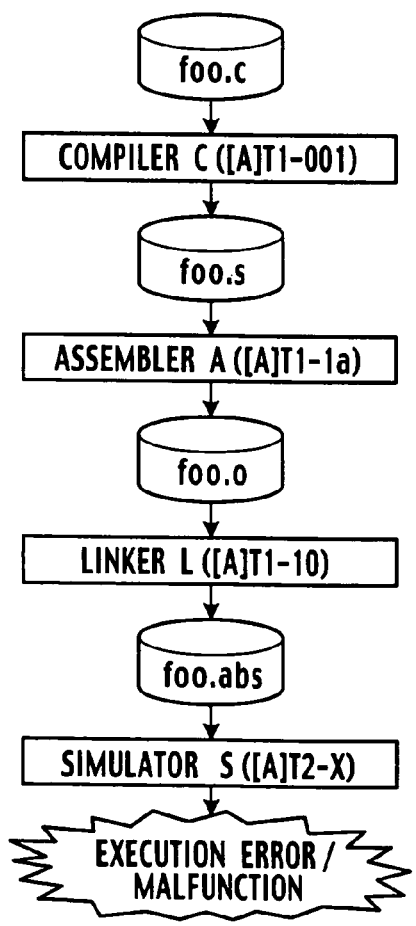

TO THE FOLLOWING PROCESSING STEP

FIG. 13A
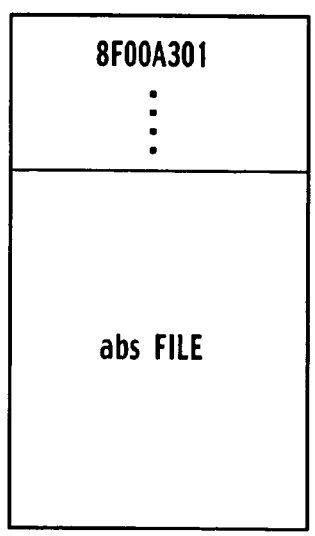
FIG. 13B
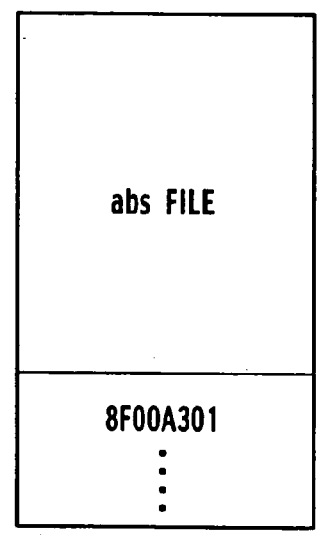
FIG. 14
| HEX | 8 | f | 0 | 0 | a | 3 | 0 | 1 |
|---|---|---|---|---|---|---|---|---|
| BINARY | 1 0 0 0 | 1 1 1 1 | 0 0 0 0 | 0 0 0 0 | 1 0 1 0 | 0 0 1 1 | 0 0 0 0 | 0 0 0 1 |
— opt B:"0"(OFF)
— opt A:"1"(ON)
— D$:"0"(OFF)
— I$:"1"(ON)
— Version:"0.1"

APPARATUS AND PROGRAM FOR DESIGNING SYSTEM LSI, AND METHOD FOR VERIFYING INTEGRITY OF THE PROGRAM FOR DESIGNING SYSTEM LSI

CROSS REFERENCE TO RELATED APPLICATIONS

This application claims benefit of priority under 35 USC §119 to Japanese Patent Application No. 2003-397160 filed on Nov. 27, 2003, the entire contents of which are incorporated by reference herein.

BACKGROUND OF THE INVENTION

1. Field of the Invention

The present invention pertains to an apparatus and a computer executable program for designing a system Large Scale Integration (system LSI) including a processor configurable in accordance with a target (configurable processor) and to a computer implemented method for verifying integrity between the computer executable programs for the same. In particular, the present invention pertains to a technology for aid to maintain the integrity of a series of the processing programs used for designing the system LSI.

2. Description of the Related Art

Conventionally, in a design of a system LSI, such as a System on Chip (SoC) including a configurable processor in which instructions can be added and/or configurations can be changed according to a target, as for a designer, it is indispensable to describe a source program for an algorithm required of a system for development by using high-level languages, such as C programming language, and to perform a system simulation in a higher level in order to verify functions as the system.

More specifically, as shown in FIG. 1, the designer describes the algorithm in a source program by using the high-level languages in Step S901. In Step S902, the designer selects a configuration of a processor installed in the system LSI, and creates processing programs (design tools), such as a compiler, a simulator and the like. In Step S903, compilation of the source program and a simulation are performed. In Step S904, the designer then verifies whether or not required performance is achieved.

As a result of the verification in Step S904, if the required performance is not achieved, in Step S905, the designer determines whether or not combinations of the processor configurations remain to be verified. If the combinations of the processor configurations remain to be verified, the designer returns to Step S902 and re-designs from selecting the configuration of the processor (in Steps S902 to S904). On the other hand, if all of the combinations of the processor configurations to be verified have been selected, in Step S906, the designer selects a portion to be implemented by hardware and divides the portion to be replaced with the hardware from among functions described in the source program. Then, the designer, in Step S907, retries the compilation of the source program and the system simulation, and, in Step S908, verifies whether or not the required performance is achieved. As a result of the verification in Step S908, if the required performance is not achieved, in Step S909, the designer re-designs including the selection of the algorithm and returns to Step S901.

As a result of the verification in Step S908 or S904, if the required performance is achieved, the work for implementation, such as a tune-up the software, a high-level synthesis, a design by using manpower, and the like, is performed in Step S910.

In the above processing of Step S903 or S907, it is generally performed through the processing procedure including two or more steps, for example, two or more processing programs, such as compiling, assembling, linkage, a simulation or the like. The processing program (design tools) in the each step inputs data (file) generated by the processing program in the previous step. Further, the processing program in the each step inputs required data, inputs the set-up starting option and processes data, according to a target of the each step.

If the data process performed by the processing program is completed normally in each step and a result of the processing satisfies specifications of the system LSI as a target, a processing program (design tool) in the following step performs data processing by using the data (file) generated by the current processing program. If an error is detected in the data processing by the processing program or a result of the processing does not satisfy the specifications of the system LSI as the target, the designer returns to the previous step as needed, corrects the input data etc., and re-performs the processing programs.

As explained above, the data for designing is processed one by one by the two or more processing programs (design tools) in order to design. In particular, in the case of the design of the system LSI including the configurable processor, for example, when the configuration of the processor to be selected, such as cache memory size, an option instruction, etc. is changed, each processing program (design tool) also needs to change according to the changed configuration of the processor.

For this reason, a system LSI design apparatus for generating the design tools which can be processed in a coherent way according to the changed configuration of the processor is disclosed in Japanese patent Laid Open Publication (Kokai) No. 2002-230065.

In the case of designing the system LSI by using such as the design apparatus disclosed in above publication, functions and performance of the source program in which the specification of the system LSI is described are inspected and verified in accordance with the processing procedure of Steps S902 to S905 (or Steps S906 to S908) shown in FIG. 1.

At this stage, since the inspection and verification of the processor, which the composition differs, specified by using configuration information, are performed, the processing programs (design tools) different for every configuration are generated and used respectively as shown in FIG. 2. However, since two or more staffs often share the work such as the inspection and verification, there had been a lack of communication between the staffs accompanying change of the processing programs (design tools). Therefore, as shown in FIG. 4, a human mistake that configuration information [A] of the compiler (C([A]T1-001)) for compiling a source program (foo.c) differs from configuration information [B] of an assembler (A([B]T1-1a)) for assembling a compile result (foo.s) occurs. Consequently, an execution error and/or a malfunction are caused without executing correctly.

Furthermore, in the case that a generation tool for generating processing programs (design tools) is updated from Version T1 to new version T2 in order to improve the performance or to correct a bug as shown in FIG. 3, if mistake of executing with the Version T1 of the compiler (C([A]T1-001)), the assembler (A([A]T1-1a)) and a linker (L([A]T1-10)) differed from the Version T2 of a simulator (S([A]T2-x)) occurs, consequently, an execution error and/or a malfunction are caused as shown in FIG. 5.

As explained above, in the case of designing the system LSI including the configurable processor, since many processing programs (design tools) were generated accompanying the change of the configuration of the processor to be selected and it is necessary to use the generated processing programs properly according to execution environment, it was the problem that enormous amounts of cost and time were required for managing the version, environment, etc. Furthermore, as explained above, since the execution error and malfunction are caused when the processing programs (design tools) of the mistaken version is performed, it was the problem that enormous amounts of cost and time were required for elucidating the cause, re-executing, etc.

SUMMARY OF THE INVENTION

An apparatus for designing a system LSI including a processor configurable in accordance with a target, according to an embodiment of the present invention, includes a series of processing programs used for the design of the system LSI, each of the processing programs configured to input a file outputted from a previous processing program and to output a file to be inputted to the following processing program. Each of the processing programs includes: an integrity information storage section configured to store integrity information between the processing programs; an integrity information identification section configured to identify integrity information included in the inputted file; an integrity verification section configured to verify whether or not integrity is maintained between the processing programs by comparing the identified integrity information and the integrity information stored in the integrity information storage section; and an integrity information addition section configured to add integrity information into the output file and to output the output file in which the integrity information is added.

Furthermore, a series of computer executable processing programs for designing a system LSI including a processor configurable in accordance with a target, according to an embodiment of the present invention, each of the processing programs used for the design of the system LSI, and configured to input a file outputted from a previous processing program and to output a file to be inputted to the following processing program, each of the processing programs includes: identifying whether or not integrity information is included in the inputted file; verifying whether or not integrity is maintained between the processing programs by comparing the identified integrity information and integrity information previously stored for each of the processing programs; and adding integrity information into the output file and outputting the output file in which the integrity information is added.

Moreover, a computer implemented method for verifying integrity of a series of computer executable processing program for designing a system LSI including a processor configurable in accordance with a target, according to an embodiment of the present invention, the computer implemented method includes: inputting a file outputted from a previous processing program and identifying whether or not integrity information is included in the inputted file; verifying whether or not the integrity is maintained between the processing programs by comparing the identified integrity information and integrity information previously stored for each of the processing programs; and adding integrity information into an output file to be inputted to the following processing program and outputting the output file in which the integrity information is added.

BRIEF DESCRIPTION OF THE DRAWINGS

FIG. 1 is a flow chart showing an example of a typical design procedure of a system LSI including a configurable processor.

FIG. 2 is an illustration showing an example of processing programs (design tools) respectively generated, varying among configurations.

FIG. 3 is an illustration showing an example of processing programs (design tools) respectively generated, varying among versions of design tool generator.

FIG. 4 is a flowchart showing an example of the processing programs (design tools) performed without maintaining integrity between the processing programs shown in FIG. 2.

FIG. 5 is a flowchart showing an example of the processing programs (design tools) performed without maintaining integrity between the processing programs shown in FIG. 4.

FIG. 13A is an illustration showing an example of a comment field for adding the integrity information provided in the top of designing data to be outputted, and FIG. 13B is an illustration showing an example of a comment field for adding the integrity information provided in the bottom of the designing data to be outputted.

FIG. 14 is an illustration showing an example of the data structure of the integrity information shown in FIGS. 11 to 13B.

DETAILED DESCRIPTION

Figure 6:
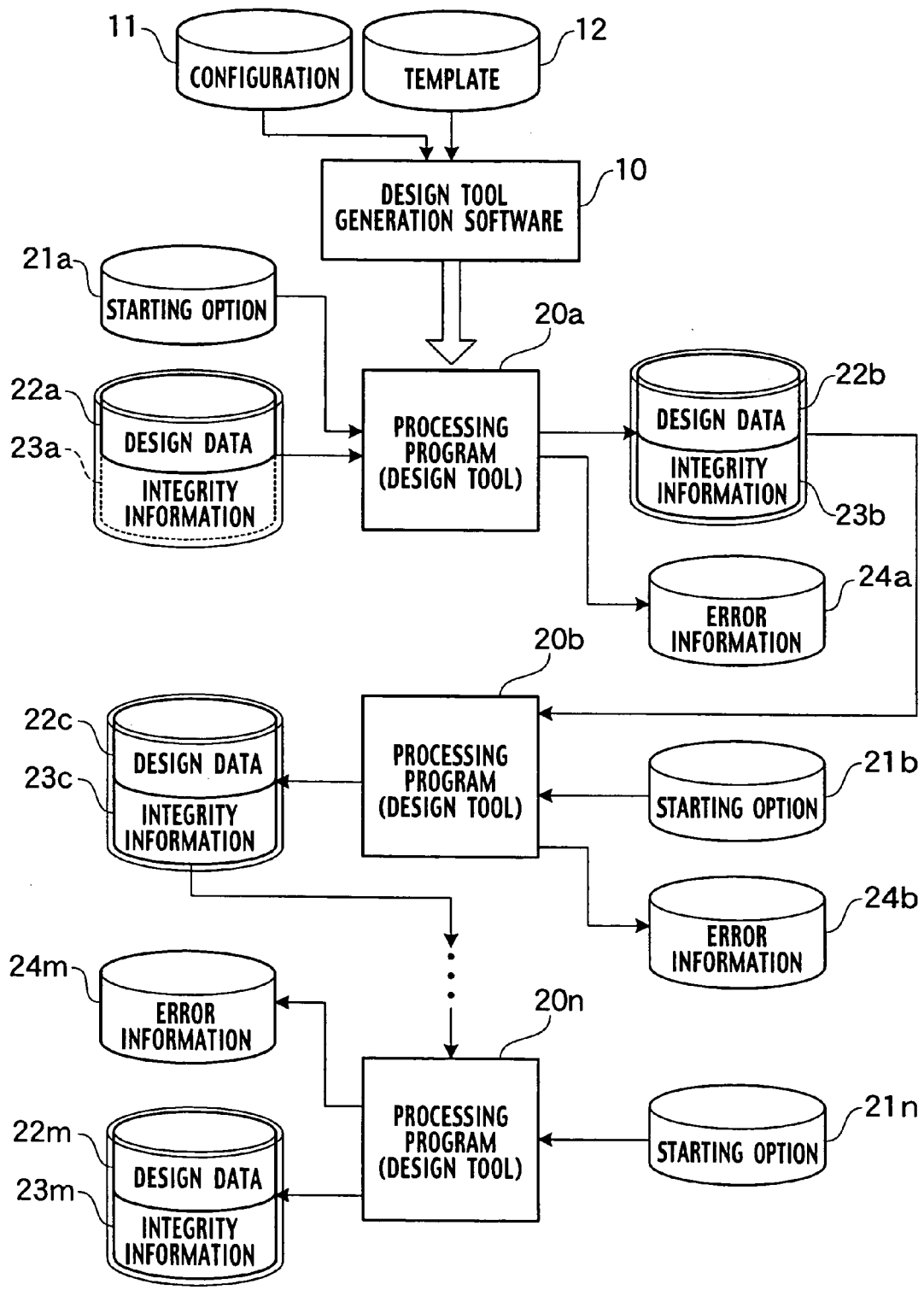
FIG. 6 is a simplified block diagram showing an example of a configuration of an apparatus for designing a system LSI including a configurable processor, according to an embodiment of the present invention.

Various embodiments of the present invention will be described herein below with reference to the accompanying drawings. It is to be noted that the same or similar reference numerals are applied to the same or similar parts and elements throughout the drawings, and the description of the same or similar parts and elements will be omitted or simplified.

The present embodiment aims to disclose a system LSI design apparatus, a system LSI design program and an integrity verification method, which can maintain the integrity of a series of computer executable programs (design tools) for designing a system LSI including a configurable processor.

Components of System LSI Design Apparatus

An apparatus for designing a system LSI according to the present embodiment is a design apparatus for designing a system LSI including a configurable processor in which instructions can be added or configurations can be changed according to a target system. The design apparatus is, for example, implemented by a computer system having a central processing unit, a memory storage, an input unit, an output unit, and the like.

As shown in FIG. 6, the design apparatus of the present embodiment includes a series of processing programs (design tools) 20a, 20b, . . . , 20n for designing the system LSI including the configurable processor. Each of the processing programs 20a, 20b, . . . , 20n is generated by a design tool generation software 10 based on configuration information 11 for specifying a processor configuration and templates 12.

Each of the processing programs 20a, 20b, . . . , 20n is configured to input a file outputted from a previous processing program, and to output a file to be inputted to the following processing program. For example, the processing program 20a inputs design data 22a (and integrity information 23a), and then outputs design data 22b and integrity information 23b to be inputted to the following processing program 20b. Similarly, the processing program 20b inputs the design data 22b and the integrity information 23b outputted from the processing program 20a, and then outputs design data 22c and integrity information 23c to be inputted to the following processing program (not shown). Further, the processing program 20n inputs design data and integrity information outputted from the processing program (not shown), and then outputs design data 22m and integrity information 23m.

Further, each of the processing programs 20a, 20b, 20n respectively inputs a starting option 21a, 21b, . . . , 21n as necessary, and then performs processing according to the specified starting option. Furthermore, each of the processing programs 20a, 20b, . . . , 20n respectively outputs error information 24a, 204, . . . , 24n when it determines that the integrity is not maintained.

Figure 7:
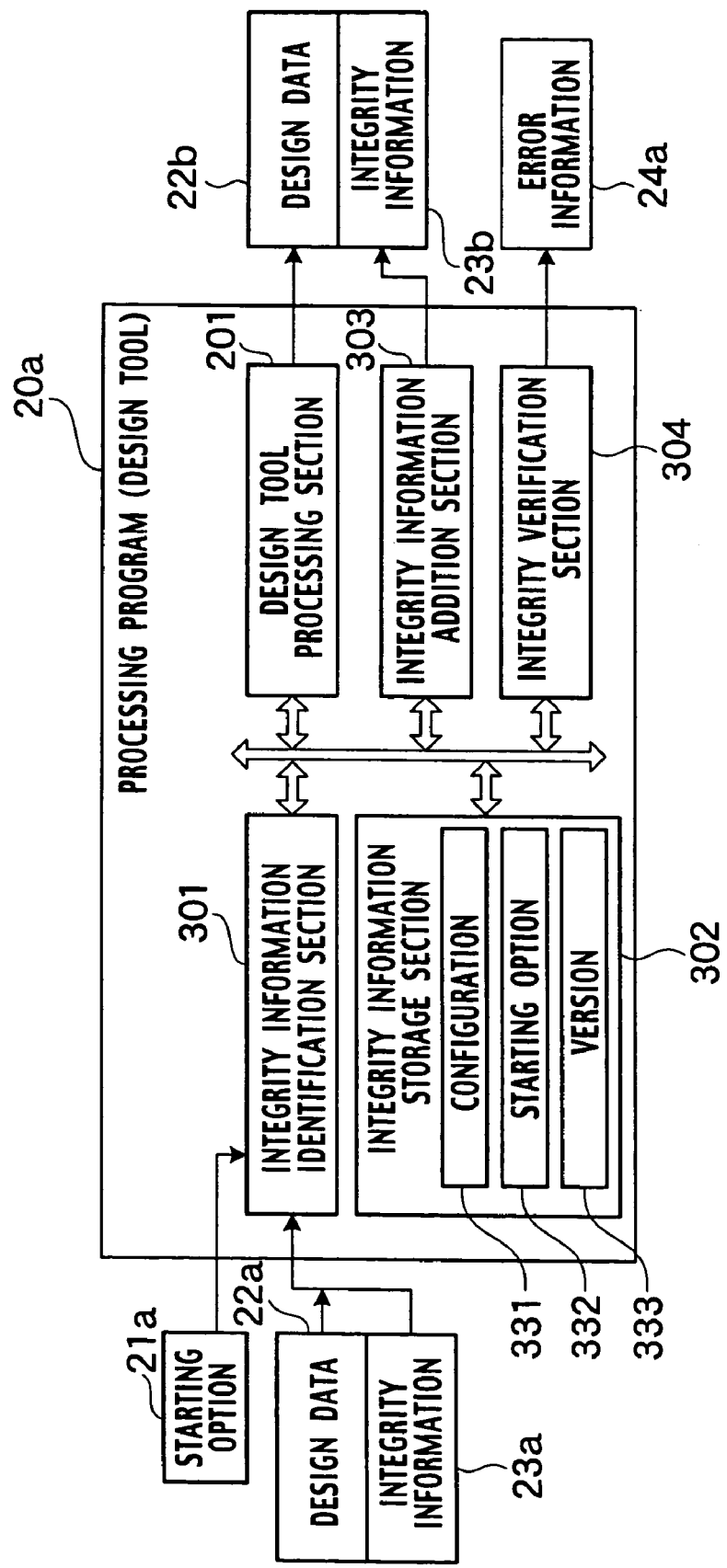
FIG. 7 is a simplified block diagram showing an example of an internal configuration of a processing program (design tool) installed in the apparatus for designing the system LSI shown in FIG. 6.

FIG. 7 shows a representative example of an internal configuration of the processing program 20a among the processing programs 20a, 20b, . . . , 20n. The processing program 20a includes a design tool processing section 201, an integrity information identification section 301, an integrity information storage section 302, an integrity verification section 304, an integrity information addition section 303, and the like.

The design tool processing section 201 processes design data 22a included in the input file (for example, performs compiling and linkage), and then outputs design data 22b as a result of the processing for the following processing program.

The integrity information identification section 301 identifies integrity information 23a included in the input file.

The integrity information storage section 302 stores the integrity information between the processing programs. The integrity information stored in the integrity information storage section 302 includes at least one of information with regard to configuration information 331, starting option information 332 and version information 333. The configuration information 331 stores information with regard to the configuration 11 (information of the processor configuration) inputted at the time when the design tool generation software 10 generates the processing program 20a. The version information 333 stores information with regard to version information at the time when the processing program 20a is generated. Furthermore, the starting option information 332 stores information with regard to the starting option specified at the time when the processing program 20a is started.

The integrity verification section 304 verifies whether or not the integrity is maintained between the processing programs by comparing the integrity information 23a identified by the integrity information identification section 301 and the integrity information 331, 332, 333 stored in the integrity information storage section 302. As a result of the verification, if the integrity is not maintained, the integrity verification section 304 outputs the error information 24a.

As a result of the verification by the integrity verification section 304, if the integrity is maintained, the integrity information addition section 303 adds the integrity information 23b into the output file and then outputs the output file.

Processing Operation of System LSI Design Apparatus

Figure 8:
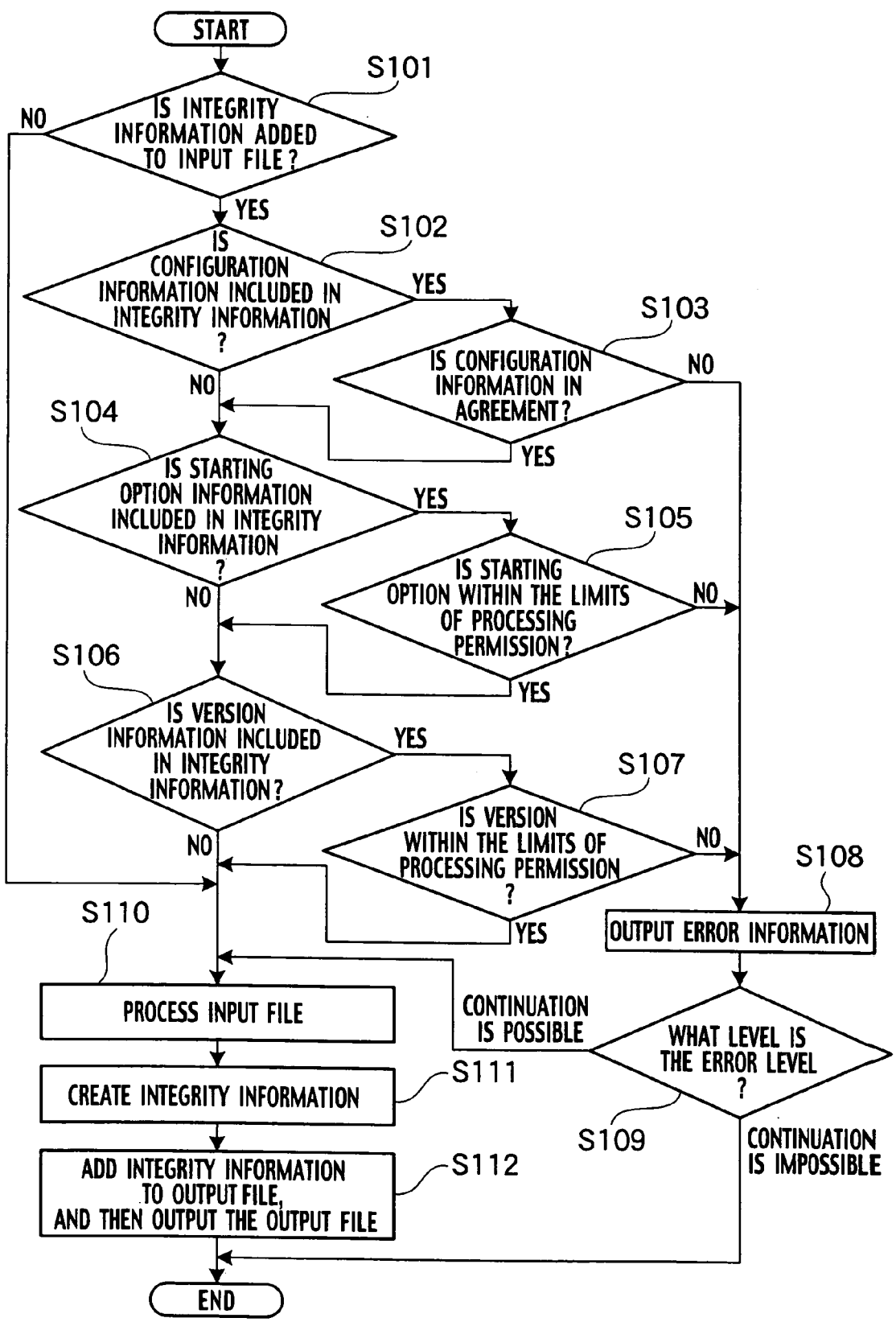
FIG. 8 is a flow chart showing an example of an integrity verification procedure performed by the respective processing programs (design tools) in the apparatus for designing the system LSI shown in FIG. 6.

FIG. 8 shows an example of a processing procedure for verifying the integrity performed by the processing programs (design tools) 20a, 20b, . . . , 20n in the system LSI design apparatus.

In addition, the design processing procedure shown in FIG. 8 can be converted to a computer program, and then the system LSI design apparatus of the present embodiment implemented by a computer system may be read the computer program stored in a computer-readable recoding medium and may perform each processing described in the computer program.

As shown in FIG. 8, first, in Step S101, the integrity information identification section 301 discriminates whether or not the integrity information 23a is added in the input file. As a result of the discrimination, if the integrity information 23a is added to the input file, this processing goes to Step S102. On the other hand, if the integrity information 23a is not added to the input file, this processing goes to Step S110.

In Step S102, the integrity verification section 304 discriminates whether or not the configuration information is included in the integrity information 23a added in the input file. As a result of the discrimination, if the configuration information is included in the integrity information 23a, in Step S103, the integrity verification section 304 discriminates whether or not the discriminated configuration information is in agreement with the configuration information 331 (that is, the configuration information 11 set up at the time of generating the current design tool) previously stored in the integrity information storage section 302. As a result of the discrimination, if the discriminated configuration information is not in agreement with the configuration information 331, the integrity verification section 304 performs an error processing in Step S108.

If the configuration information is not included in the integrity information 23a added in the input file as a result of the discrimination in Step S102, or if the configuration information added in the input file is in agreement with the configuration information 331 previously stored in the integrity information storage section 302 as a result of the discrimination in Step S103, this processing goes to Step S104.

In Step S104, the integrity verification section 304 discriminates whether or not the starting option information is included in the integrity information 23a added in the input file. As a result of the discrimination, if the starting option information is included in the integrity information 23a, in Step S105, the integrity verification section 304 discriminates whether or not the discriminated starting option information is within the limits of processing permission by comparing the discriminated starting option information and the starting option information 332 (that is, the starting option information 11 set up at the time of starting the current design tool) previously stored in the integrity information storage section 302. As a result of the discrimination, if the discriminated starting option information is not within the limits of processing permission, the integrity verification section 304 performs an error processing in Step S108.

If the starting option information is not included in the integrity information 23a added in the input file as a result of the discrimination in Step S102, or if the starting option information added in the input file is within the limits of the processing permission as a result of the discrimination in Step S103, this processing goes to Step S106.

In Step S106, the integrity verification section 304 discriminates whether or not the version information is included in the integrity information 23a added in the input file. As a result of the discrimination, if the version information is included in the integrity information 23a, in Step S107, the integrity verification section 304 discriminates whether or not the discriminated version information is within the limits of processing permission by comparing the discriminated version information and the version information 333 (that is, the version at the time of generating the current design tool) previously stored in the integrity information storage section 302. As a result of the discrimination, if the discriminated version information is not within the limits of processing permission, the integrity verification section 304 performs an error processing in Step S108.

The disagreement is detected in at least one of Step S103, S105 and S107, the integrity verification section 304 outputs integrity error information to the error information file 24a in Step S108, and discriminates the level of the integrity error. As the result of the discrimination, if the integrity error is the level that the processing continuation is possible, this processing goes to Step S110. Conversely, if the integrity error is the level that the processing continuation is impossible, this series of the processing is ended.

On the other hand, the version information is not included in the integrity information 23a added in the input file as a result of the discrimination in Step S106, or the version information is within the limits of the processing permission as a result of the discrimination in Step S107, this processing goes to Step S110.

In Step S110, the design tool processing section 201 performs predetermined process on the design data 22a of the input file.

In Step S111, the integrity information addition section 303 creates the integrity information 23b to be used in the following processing program (design tool) based on the integrity information 23a included in the input file and the information of the integrity information storage section 302. In Step S112, the integrity information addition section 303 adds the created integrity information 23b into the design data 22b and then outputs it to the output file.

In addition, the sequence of the process for verifying the integrity information (configuration information, starting option information and version information) shown in Step S102 to S107 is not limited to the sequence of the process shown in FIG. 8, the verification processing may be processed in different sequence or may be processed in parallel.

Figure 9:
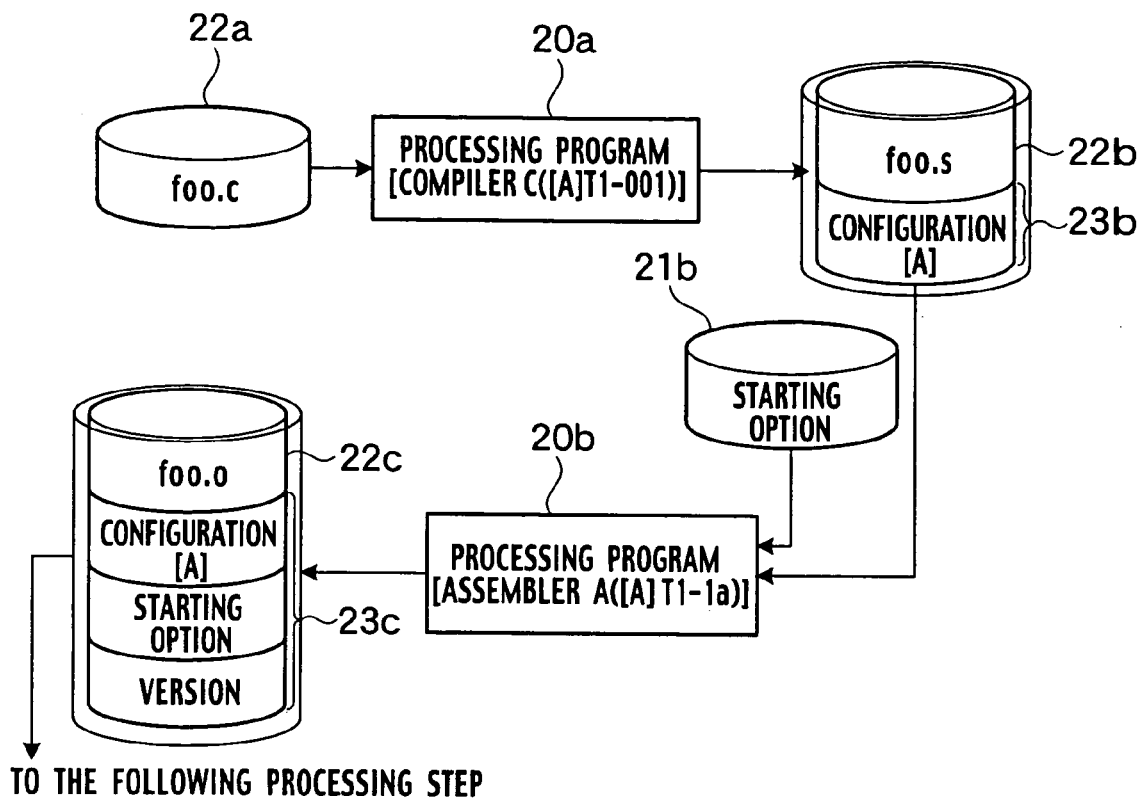
FIG. 9 is an illustration showing an example of the processing programs executed in the apparatus for designing the system LSI shown in FIG. 6.

Since each of the processing programs (design tools) 20a, 20b, . . . , 20n respectively performs the above-mentioned processing, for example, a compiler (C([A]T1-001) as the processing program 20a inputs a source program (foo.c), adds configuration information [A] into a compilation result and then outputs it, as shown in FIG. 9. Then, an assembler (A([A]T1-1a) as the processing program 20b inputs the compilation result outputted from the compiler (C([A]T1-001) and the configuration information [A] and a starting option 21b, performs the series of the above-mentioned processing, and outputs an assembling result (foo.o) and the integrity information 23c to be used in the following processing program (not shown).

Figure 10:
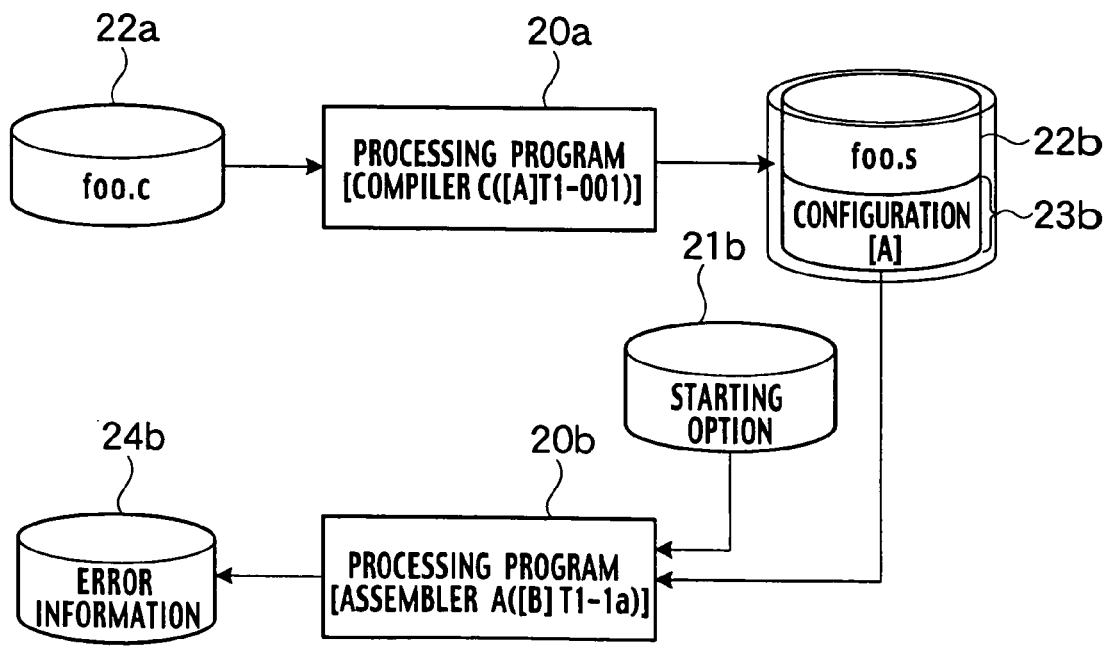
FIG. 10 is an illustration showing an example of an integrity error occurred between the processing programs executed in the apparatus for designing the system LSI shown in FIG. 6.

As shown in FIG. 10, for example, if the configuration information [A] of the compiler (C([A]T1-001) is not agreement with the configuration information [B] of the assembler (A([B]T1-1a), the assembler (A([B]T1-1a) as the processing program 20b outputs integrity error information to the error information file 24a, and then terminates this processing or transfers control to the following processing step according to the error level.

When each of the processing programs (design tools) 20a, 20b, . . . , 20n adds the integrity information 23a, 23b, . . . , 23n into the output file, the integrity information 23a, 23b, . . . 23n is converted to the predetermined form according to the data form of the design data 22a, 22b, . . . , 22n outputted from each of the processing programs 20a, 20b, . . . , 20n.

Figure 11:
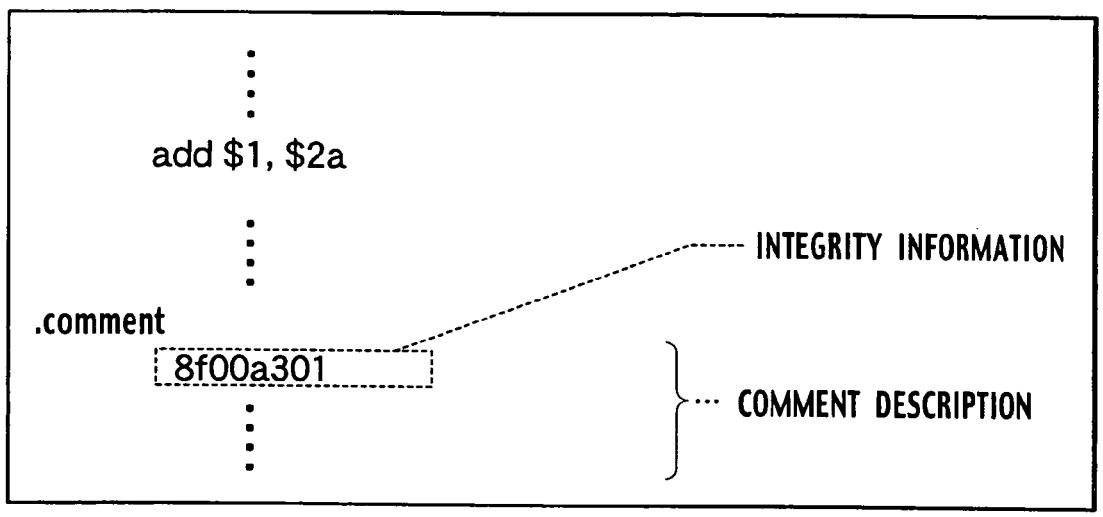
FIG. 11 is an illustration showing an example of an output file in which integrity information is added in the case that the output file is text form.
Figure 12:
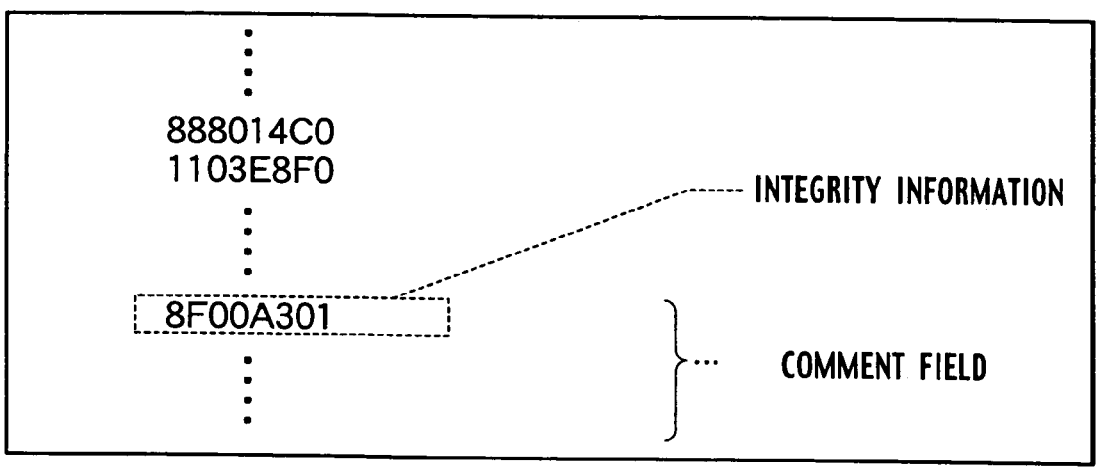
FIG. 12 is an illustration showing an example of an output file in which integrity information is added in the case that the output file is binary form.

For example, if the data form of the output file is text form such as a complier of C programming language, the integrity information ("8f00a301") is written in a comment description as shown in FIG. 11.

On the other hand, if the data form of the output file is binary form such as an assembler or a linker, the integrity information (0x8f00a301) is written in a comment field. In addition, the comment field for adding the integrity information may be located at the top of the design data to be outputted as shown in FIG. 13A, or may be located at the bottom of the design data as shown in FIG. 13B. The following processing program can identify the added integrity information and process it, by referring a data size of the output file indicated in the top of the output file outputted from the previous processing program or a data size of the comment field.

For example, the integrity information shown in FIGS. 11 to 13B has a data structure such as shown in FIG. 14. The value of the integrity information shown in FIG. 14 means that an option instruction-A is enable (ON: "1"), an option instruction-B is disable (OFF: "0"), an instruction cache (I$) is enable (ON: "1"), and a data cache (D$) is disable (OFF: "0"). Further, the last 8 bits of the value of the integrity information means that the version number is "0.1".

As explained above, each of the processing programs (design tools) is configured to add the integrity information, such as the configuration information, the option information, the version information and the like, into the performed design data, and to output the design data including the integrity information to the output file. Further, each of the processing programs (design tools) is configured to determine whether or not the integrity is maintained by verifying the integrity information added in the input file. As a result of the determination, if the integrity is not maintained, the processing program outputs the error information, and terminates or continues the processing according to the error level. Therefore, it is possible to detect and prevent trouble caused by the integrity between the processing programs (design tools) not being maintained. Thus, it is possible to reduce greatly the length of time and the amount of cost required for resolving the cause of the trouble.

Other Embodiment

Although the embodiments of the present invention have been described in detail, the present invention may be embodied in other specific forms without departing from the spirit or essential characteristics thereof.

Figure 15:
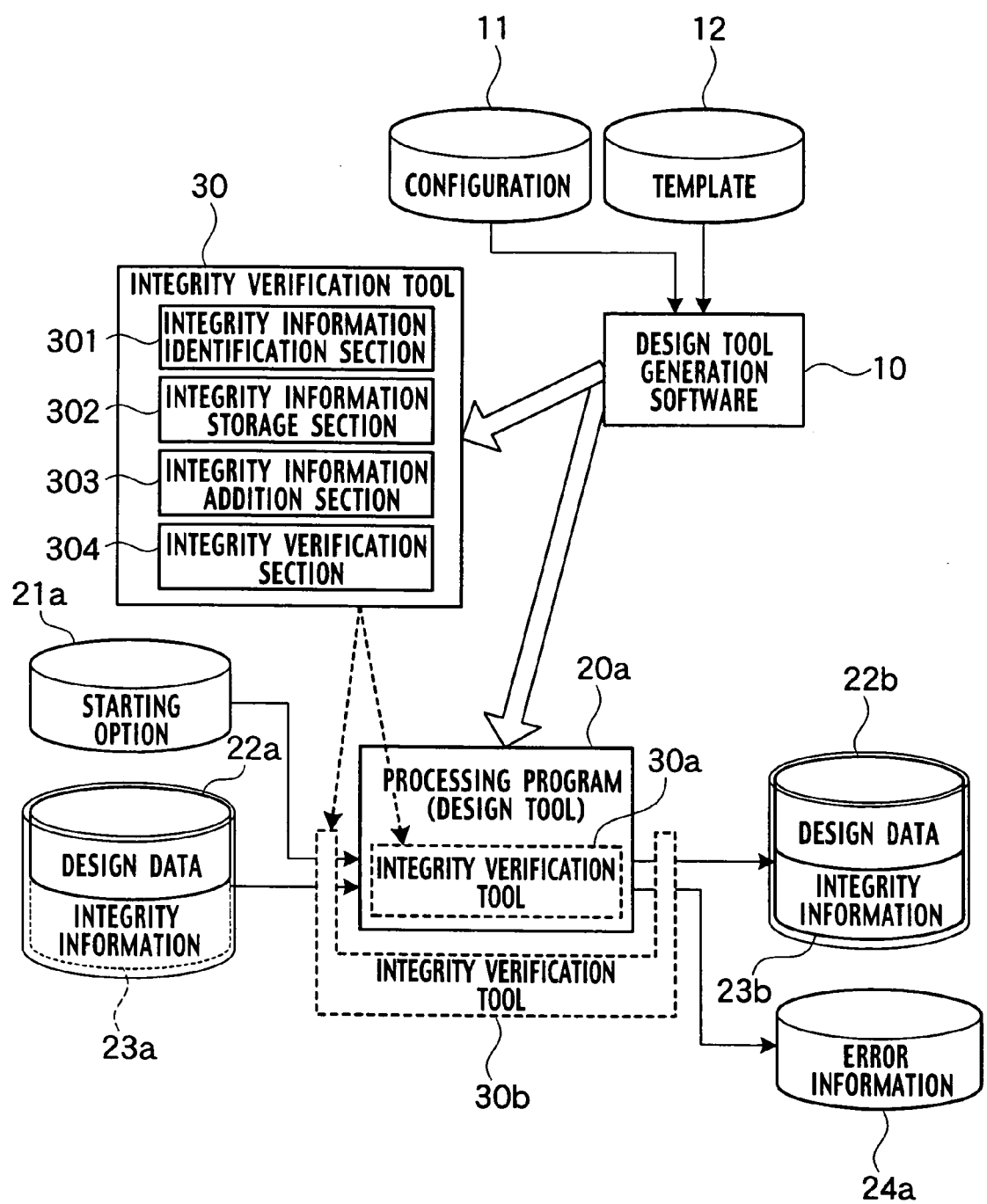
FIG. 15 is a simplified block diagram showing another example of the configuration of the apparatus for designing the system LSI including the configurable processor.

For example, as shown in FIG. 15, the integrity information identification section 301, the integrity information storage section 302, the integrity information addition section 303 and the integrity information verification section 304 may be independent of the processing program 20a and generated as an integrity verification tool 30 for common use. The integrity verification tool 30 generated independently may be built into the inside of each processing program so as an integrity verification tool 30a, or may be also installed in the outside of the processing program so as an integrity verification tool 30b. According to the above composition, it is possible to render the size of the generated processing programs (design tools) 20a, 20b, . . . , 20n even more compact, and also to ensure greater ease in handling.

Furthermore, it can also set up whether or not to execute the independent integrity verification tool 30, by using the starting option 21a of each processing program. For example, in the case of a processing program (design tool) which uses the same design data over and over again, execution of the integrity verification tool 30 can be skipped by only changing the starting option 21a, and therefore it is possible to reduce greatly the length of time required for designing the system LSI.

Moreover, it can also set up whether or not to output the integrity information, such as the configuration information, the option information and the version information, by using the starting option 21a of each processing program. In this case similarly, in the processing program (design tool) which uses the same design data over and over again, the amount of data of the output file can be reduced by only changing the starting option 21a, and therefore it is possible to reduce greatly the length of time required for designing the system LSI.

The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An apparatus for designing a system LSI including a processor configurable in accordance with a target, the apparatus comprising
a series of processing programs used for the design of the system LSI, each of the processing programs configured to input a file outputted from a previous processing program and to output a file to be inputted to the following processing program, the series of processing programs generated respectively for the design of respective the plural system LSIs corresponding to different configurations, each of the processing programs comprising:
an integrity information storage section configured to store integrity information between each of the processing programs;
an integrity information identification section configured to identify integrity information included in the file inputted from the previous processing program, the identify integrity information added by the previous processing program;
an integrity verification section configured to verify whether or not integrity is maintained between the previous processing program and the current processing program by comparing the identified integrity information and the integrity information stored in the integrity information storage section; and
an integrity information addition section configured to add integrity information into the output file and to output the output file in which the integrity information is added, the integrity information created based on the identified integrity information included in the inputted file and the integrity information stored in the integrity information storage section, and the created integrity information used for the following processing program in order to verify whether or not integrity is maintained.

2. The apparatus of claim 1, wherein
the integrity information includes at least one of information with regard to configuration information of the system LSI to be designed, starting option information of the processing program and version information of the processing program.

3. The apparatus of claim 1, wherein
as a result of the comparison, if the integrity is not maintained, the integrity verification section outputs the error information.

4. The apparatus of claim 2, wherein
as a result of the comparison, if the integrity is not maintained, the integrity verification section outputs the error information.

5. The apparatus of claim 1, wherein
the integrity information addition section adds the integrity information into a comment field of the output file.

6. A computer program product including a medium on which is stored a series of computer executable processing programs for designing a system LSI including a processor configurable in accordance with a target, each of the processing programs used for the design of the system LSI, and configured to input a file outputted from a previous processing program and to output a file to be inputted to the following processing program, the series of processing programs generated respectively for the design of respective the plural system LSIs corresponding to different configurations, each of the processing programs comprising:
identifying whether or not integrity information is included in the file inputted from the previous processing program, the identify integrity information added by the previous processing program;
verifying whether or not integrity is maintained between the previous processing program and the current processing program by comparing the identified integrity information and integrity information previously stored for each of the processing programs; and
adding integrity information into the output file and outputting the output file in which the integrity information is added, the integrity information created based on the identified integrity information included in the inputted file and the integrity information stored in the integrity information storage section, and the created integrity information used for the following processing program in order to verify whether or not integrity is maintained.

7. The computer program product of claim 6, wherein the integrity information includes at least one of information with regard to configuration information of the system LSI to be designed, starting option information of the processing program and version information of the processing program.

8. The computer program product of claim 6, wherein as a result of the comparison in the verification of the integrity information, if the integrity is not maintained, the error information is outputted.

9. The computer program product of claim 7, wherein as a result of the comparison in the verification of the integrity information, if the integrity is not maintained, the error information is outputted.

10. The computer program product of claim 6, wherein the integrity information is added into a comment field of the output file.

11. A computer readable recording medium storing a series of computer executable processing programs for designing a system LSI including a processor configurable in accordance with a target, each of the processing programs used for the design of the system LSI, and configured to input a file outputted from a previous processing program and to output a file to be inputted to the following processing program, the series of processing programs generated respectively for the design of respective the plural system LSIs corresponding to different configurations, each of the processing programs comprising:

identifying whether or not integrity information is included in the file inputted from the previous processing program, the identify integrity information added by the previous processing program;

verifying whether or not integrity is maintained between the previous processing program and the current processing program by comparing the identified integrity information and integrity information previously stored for each of the processing programs; and adding integrity information into the output file and outputting the output file in which the integrity information is added, the integrity information created based on the identified integrity information included in the inputted file and the integrity information stored in the integrity information storage section, and the created integrity information used for the following processing program in order to verify whether or not integrity is maintained.

12. The computer readable recording medium of claim 11, wherein the integrity information includes at least one of information with regard to configuration information of the system LSI to be designed, starting option information of the processing program and version information of the processing program.

13. The computer readable recording medium of claim 11, wherein as a result of the comparison in the verification of the integrity information, if the integrity is not maintained, the error information is outputted.

14. The computer readable recording medium of claim 12, wherein as a result of the comparison in the verification of the integrity information, if the integrity is not maintained, the error information is outputted.

15. The computer readable recording medium of claim 11, wherein the integrity information is added into a comment field of the output file.

16. A computer implemented method for verifying integrity of a series of computer executable processing program for designing a system LSI including a processor configurable in accordance with a target, the series of processing programs generated respectively for the design of respective the plural system LSIs corresponding to different configurations, the computer implemented method comprising:

inputting a file outputted from a previous processing program and identifying whether or not integrity information is included in the inputted file, the identify integrity information added by the previous processing program;

verifying whether or not the integrity is maintained between previous processing program and the current processing program by comparing the identified integrity information and integrity information previously stored for each of the processing programs; and adding integrity information into an output file to be inputted to the following processing program and outputting the output file in which the integrity information is added, the integrity information created based on the identified integrity information included in the inputted file and the integrity information stored in the integrity information storage section, and the created integrity information used for the following processing program in order to verify whether or not integrity is maintained.

17. The computer implemented method of claim 16, wherein the integrity information includes at least one of information with regard to configuration information of the system LSI to be designed, starting option information of the processing program and version information of the processing program.

18. The computer implemented method of claim 16, wherein as a result of the comparison in the verification of the integrity information, if the integrity is not maintained, the error information is outputted.

19. The computer implemented method of claim 17, wherein as a result of the comparison in the verification of the integrity information, if the integrity is not maintained, the error information is outputted.

20. The computer implemented method of claim 16, wherein the integrity information is added into a comment field of the output file.

* * * * *